United States Patent
Martin

(10) Patent No.: US 10,388,641 B2
(45) Date of Patent: Aug. 20, 2019

(54) ULTRA-DENSE LED PROJECTOR

(71) Applicant: Spy Eye, LLC, Los Gatos, CA (US)

(72) Inventor: Paul Scott Martin, Palo Alto, CA (US)

(73) Assignee: Tectus Corporation, Saratoga, CA (US)

( * ) Notice: Subject to any disclaimer, the term of this patent is extended or adjusted under 35 U.S.C. 154(b) by 0 days.

(21) Appl. No.: 15/894,712

(22) Filed: Feb. 12, 2018

(65) Prior Publication Data

US 2019/0123033 A1    Apr. 25, 2019

Related U.S. Application Data

(60) Provisional application No. 62/574,717, filed on Oct. 19, 2017.

(51) Int. Cl.
*H01L 25/18* (2006.01)
*H01L 33/20* (2010.01)
(Continued)

(52) U.S. Cl.
CPC .............. *H01L 25/18* (2013.01); *H01L 24/05* (2013.01); *H01L 24/08* (2013.01); *H01L 24/13* (2013.01);
(Continued)

(58) Field of Classification Search
CPC ......... H01L 25/18; H01L 24/05; H01L 24/08; H01L 24/13; H01L 24/16; H01L 27/156;
(Continued)

(56) References Cited

U.S. PATENT DOCUMENTS 4,268,842 A   5/1981   Jacob et al.
4,408,217 A  10/1983   Kobayashi et al.
(Continued)

FOREIGN PATENT DOCUMENTS

WO   WO 2009/143802 A1   12/2009
WO   WO 2011/029935 A2    3/2011
WO   WO 2016/079505 A1    5/2016

OTHER PUBLICATIONS

Hernsdorf, J. et al., "Active-Matrix GaN Micro Light-Emitting Diode Display with Unprecedented Brightness," IEEE Transactions on Electron Devices, Jun. 2015, pp. 1918-1925, vol. 62, No. 6.
(Continued)

*Primary Examiner* — Elias Ullah
(74) *Attorney, Agent, or Firm* — Fenwick & West LLP

(57) ABSTRACT

A monolithic display/projector is disclosed comprising a single die having an array of mechanically isolated LED pillars. Each pillar has a height greater than its width, and a pitch between pillars is less than the heights of the pillars. The die comprises an LED display portion bonded to a silicon substrate addressing portion, with one metal contact per pixel. The resolution of the display is preferably about the same as the resolution of the human retina when projected onto the human retina so that the image projected onto the retina may be indistinguishable from the real world. The display may be encapsulated into a contact lens with a focusing optic embedded into the contact lens. To electrically contact the N-type semiconductor layer, the pillars are surrounded by a reflective cathode metal mesh so that the cathode current is coupled through the vertical sides of the N-type layer. The metal mesh mechanically connects the isolated LED pillars and optically isolates each LED pillar. The active layers may emit blue light, and wavelength conversion layers may be used to generate red and green light.

21 Claims, 19 Drawing Sheets

(51) Int. Cl.
| | |
|---|---|
| *H01L 33/40* | (2010.01) |
| *H01L 27/15* | (2006.01) |
| *H01L 33/50* | (2010.01) |
| *H01L 33/60* | (2010.01) |
| *H01L 33/64* | (2010.01) |
| *H01L 33/00* | (2010.01) |
| *H01L 33/62* | (2010.01) |
| *H01L 23/00* | (2006.01) |
| *H01L 33/32* | (2010.01) |
| *G02B 27/01* | (2006.01) |
| *H01L 27/092* | (2006.01) |

(52) U.S. Cl.
 CPC ............ *H01L 24/16* (2013.01); *H01L 27/156* (2013.01); *H01L 33/007* (2013.01); *H01L 33/0079* (2013.01); *H01L 33/20* (2013.01); *H01L 33/32* (2013.01); *H01L 33/405* (2013.01); *H01L 33/507* (2013.01); *H01L 33/60* (2013.01); *H01L 33/62* (2013.01); *H01L 33/647* (2013.01); *G02B 27/0172* (2013.01); *G02B 2027/014* (2013.01); *H01L 27/092* (2013.01); *H01L 2224/05647* (2013.01); *H01L 2224/08145* (2013.01); *H01L 2224/13006* (2013.01); *H01L 2224/13144* (2013.01); *H01L 2224/16148* (2013.01)

(58) Field of Classification Search
 CPC .. H01L 33/007; H01L 33/0079; H01L 33/647
 See application file for complete search history.

(56) References Cited

U.S. PATENT DOCUMENTS

| | | |
|---|---|---|
| 4,608,581 A | 8/1986 | Bagratishvili et al. |
| 4,707,726 A | 11/1987 | Daniele |
| 5,534,444 A | 7/1996 | Nissim et al. |
| 6,023,076 A | 2/2000 | Shibata |
| 6,233,265 B1 | 5/2001 | Bour et al. |
| 6,410,940 B1 | 6/2002 | Jiang et al. |
| 7,592,637 B2 | 9/2009 | Zimmerman et al. |
| 8,058,663 B2 | 11/2011 | Fan et al. |
| 8,552,436 B2 | 10/2013 | Bibl et al. |
| 9,041,025 B2 | 5/2015 | Lau et al. |
| 9,047,818 B1 | 6/2015 | Day et al. |
| 9,196,653 B2 | 11/2015 | Leatherdale et al. |
| 2006/0055309 A1 | 3/2006 | Ono et al. |
| 2008/0128728 A1 | 6/2008 | Nemchuk et al. |
| 2010/0060553 A1 | 3/2010 | Zimmerman et al. |
| 2011/0226937 A1 | 9/2011 | Yu et al. |
| 2012/0154876 A1* | 6/2012 | Shimoda ............ H04N 1/00013 358/453 |
| 2012/0223875 A1 | 9/2012 | Lau et al. |
| 2012/0276701 A1 | 11/2012 | Yedinak et al. |
| 2013/0126827 A1* | 5/2013 | Bibl ........................ H01L 33/04 257/13 |
| 2014/0070263 A1 | 3/2014 | Choi et al. |
| 2016/0356901 A1 | 12/2016 | Shao et al. |
| 2018/0261736 A1 | 9/2018 | Bonar et al. |

OTHER PUBLICATIONS

Choi, H.W. et al., "High-Resolution 128×96 Nitride Microdisplay," IEEE Electron Device Letters, May 2004, pp. 277-279, vol. 25, No. 5.
Day, J. et al., "III-Nitride Full-Scale High-Resolution Microdisplays," Applied Physics Letters, 2011, 2 pages, vol. 99, 031116.
Kang, C-M. et al., "Fabrication of a Vertically-Stacked Passive-Matrix Micro-LED Array Structure for a Dual Color Display," Optics Express, Feb. 6, 2017, 7 pages, vol. 25, No. 3.
Henry, W., "MicroLED Arrays Find Applications in the Very Small," Photonics Media, Mar. 2013, 7 pages.

\* cited by examiner

ULTRA-DENSE LED PROJECTOR

CROSS-REFERENCE TO RELATED APPLICATION

This application claims priority under 35 U.S.C. § 119(e) to U.S. Provisional Patent Application Ser. No. 62/574,717, "Ultra-Dense LED Projector," filed Oct. 19, 2017. The subject matter of the foregoing is incorporated herein by reference in its entirety

FIELD OF THE INVENTION

This invention relates to light emitting diode (LED) displays and, in particular, to a monolithic ultra-dense LED display, such as for use in a contact lens.

BACKGROUND

A conventional LED direct emission display uses discrete red, green, and blue emitting LEDs arranged in an addressable array of composite pixels. Such displays have a fairly large pixel spacing due to the use of separate LED dies. Displays of this type typically have resolutions of up to 500 pixels per inch (composite white pixels/inch) and about a 25 um pitch from one colored pixel to the neighboring color pixel.

In another approach, red, green, and blue emitting LEDs are combined on a single die. However, with the conventional technology to form monolithic LED displays, the practical pixel size is a minimum of several microns and about 2× in pitch between pixels, for a minimum pitch in the range of 5-10 um. Such LED displays may be referred to as micro-displays since each pixel is several square microns in area. Given a conventional die size of 1 mm or less, such an LED display typically cannot provide a resolution or composite pixel count that can emulate a real world image viewed by the human eye.

Accordingly, what is needed is an improved design to form a monolithic ultra-high resolution LED display that substantially matches the resolution of the human eye.

SUMMARY

Disclosed is an ultra-dense LED array suitable for use in a monolithic "femto-LED display" (or femtoprojector), which has a resolution that preferably substantially matches or exceeds that of the human retina. The design preferably allows the pixel sizes to be less than 1 um$^2$ in emitting area with a pixel pitch less than 2 um, such that when the displayed image is projected onto the retina, the retinal image has a similar resolution as that of a real image being augmented or replaced. In one embodiment, the spacing between pixels is less than 0.2 um and a preferred pixel diameter is about 0.5 um. If each pixel was square, its area would be about $250 \times 10^{-15}$ m$^2$ (or 250 square femto-meters).

In one approach, the higher density of LED pixels can be created by forming a single LED die and etching the die to form a dense array of separately addressable LED pixels. Such LED pixel segments can be as small as several microns across or less. If the LED die is GaN based and the LEDs emit blue light, the segments for the red and green pixels can be formed by depositing photon energy down-converting phosphors over the blue LEDs. Alternatively, if the LED die emits in the IR, red, green, and blue pixels can be created by depositing energy up-converting materials over the IR LEDs.

One possible use of such a monolithic ultra-dense LED display is to embed the display in a contact lens so that the displayed image overlays the wearer's view of the real world. The LED display may be less than 1 mm across, so it would not be visible to someone looking at the wearer and would also not substantially block light from the real world coming into the wearer's pupil. The display directly projects onto the wearer's retina.

Another possible use of the monolithic ultra-dense LED display is in eyewear, such as glasses or goggles, to create an immersive visual experience or an image that overlays the wearer's view of the real world, such as in an augmented, mixed, or artificial reality application. The LEDs in such an ultra-dense display may be distinguished from conventional LEDs by the aspect ratio of their height (or thickness) to width. Conventional LEDs are flat with aspect ratios (height:width) from less than 1:100 to 1:2. The ultra-dense LEDs disclosed herein are taller than their widths with aspect ratios (height:width) greater than 1:1 and preferably greater than 5:1. These LEDs can be visualized as an array of closely spaced "soda can" shaped LEDs having aspect ratios ranging from similar to a 12 ounce soda can (2:1) to similar to 5 soda cans stacked on top of each other (10:1).

In one embodiment, one surface (opposite the growth substrate) of the LED pixels is a P-type layer, and the growth substrate is removed to expose the underlying N-type layer. Each pixel forms a thin pillar of semiconductor material. The sub-1 um$^2$ area of the top and bottom surfaces of the pillars and the small space (e.g., sub 0.5 um) between neighboring LEDs makes it difficult to efficiently electrically contact the N-type layer "underneath" the P-layer and conduct current. A preferred embodiment provides a fill between the pillars. In one embodiment, this fill is a reflective N-metal (e.g., Al, Ag, Ni/Ag, Ti/Al) vertically surrounding and filling the space between the LED pillars to electrically contact the N-type layer along its vertical sidewall. Thus, there is a relatively large cathode contact area for low resistance and good current handling capability. This sidewall contact is further utilized to provide mechanical support for and optically isolate the individual LED pixels. The reflective N-metal, and any reflective metal overlying the N-metal, surrounding each LED pixel prevents optical cross-talk between pixels and improves efficiency. The reflective metal performs the combined functions of electrically conducting current, optically isolating the pixels, reflecting back light into the pixels, and mechanically supporting the pixels. In alternate embodiments, the fill between pillars may include other metals or materials in addition to the reflective N-metal.

In embodiments that utilize photon energy down-conversion, in one approach, for the red and green pixels, blue emission LEDs are covered with a wavelength conversion material, such as phosphor or quantum dots, to convert from blue to the desired pixel color.

In embodiments that require photon energy up-conversion, in one approach, IR LEDs are covered with a photon energy up-conversion material to convert from the IR wavelength to the appropriate pixel color of red, green or blue.

Reflective aluminum may surround the color conversion portion of the pixels, where the aluminum contacts the top surface of the N-metal. The N-metal and aluminum form a mesh around the pixels. Optical isolation between the pixels is useful to maintaining high resolution color images, and the high aluminum reflectivity maintains high efficiency.

Preferably, for use in imaging directly onto the retina, such as is done with a contact lens display, the pixels may form a honeycomb pattern (i.e., hexagonal array).

A distributed Bragg reflector (DBR) may be formed over the display to enhance directionality.

The resolution of the retina varies substantially from a peak in the fovea to a lower resolution toward the periphery. The desirability for a contact lens-based retinal projection display, where the resolution and shape of the LED pixels vary as a function of position, poses substantial challenges. The "soda can" LED array design described in this disclosure is good because the display is monolithic, with pixel sizes and shapes that can be defined photolithographically to match the variable resolution of the human eye. By varying the pixel resolution to match the varying resolution of the retina, the die area is used most efficiently by not providing a resolution that is higher than can be perceived by the human eye.

In order to address the pixels in the monolithic LED display, the LED display is mounted on a backplane substrate containing addressing circuitry.

After the formation of reflective P-metal contacts on the P-type surfaces of the pillars, and after the spaces between the pillars are filled with the N-metal to contact the N-type layers of the pillars, the top surface of the LED wafer is planarized, such as using chemical mechanical polishing (CMP), to form planar metal anode and cathode contacts. The LED wafer is then singulated, and the die are bonded to the backplane substrate wafer containing the addressing circuitry. The anode and cathode contacts of the LED die are on the same planar surface, and the array of metal contacts on the backplane substrate wafer is also planar for reliable bonding. The LED die may be less than 1 mm in diameter. Copper-copper bonding is preferred for bonding the LED die to the backplane substrate wafer.

The growth substrate is then removed from the bonded LED die, thus exposing the light emitting surface of the pixels.

In one embodiment, the color conversion layer is formed as a separate die layer and separately bonded over the light emitting surfaces of the LED dies. The backplane substrate is then singulated.

The wavelength conversion layer preferably is thin yet blocks the blue pump light so as not to sacrifice the purity of the color emitted from the conversion layer. One technique is to form a polymer matrix that deterministically arranges quantum dot crystals for good conversion and reduced absorption of the converted light. Also important to fabrication of the color conversion layer is separation of individual pixels with a reflective metal, such as aluminum, so that photons converted in the layer are reflected back from the sides and emit only from the top. Thus, photons from, for example, a green pixel are not emitted laterally into a red pixel area.

The monolithic display can be either embedded in a contact lens or be part of eye glasses or goggles that project the image onto the wearer's retina. The display may also be added to a smartphone to provide a projector function.

Other embodiments are described.

BRIEF DESCRIPTIONS OF DRAWINGS

Figure 9:
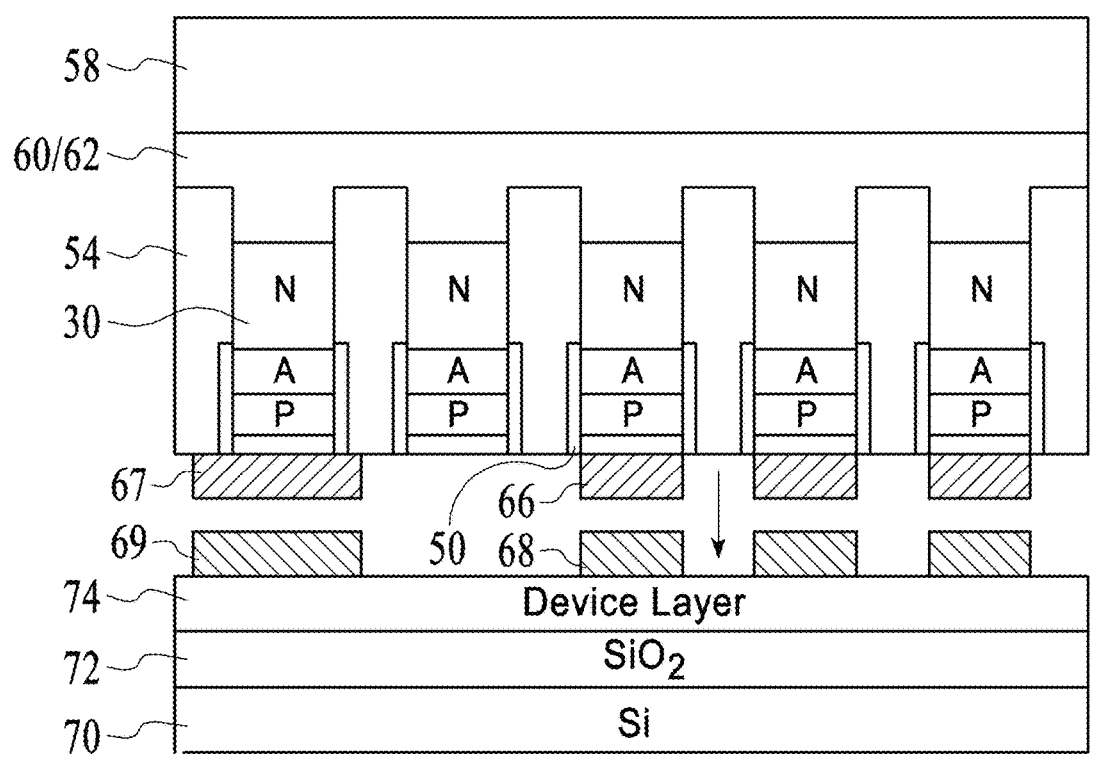

FIG. 9 illustrates the bonding of the LED die to a backplane substrate wafer, where electrical connection is made between the anode metal contact on the P-type layer in each pillar and a bump on the backplane substrate wafer for selectively applying an anode voltage to the various LED pixels, and where electrical connection is made between the N-metal contact (cathode common to all pillars) and a bump on the backplane substrate wafer for applying a reference voltage to the various LED pixels.

FIG. 10 again illustrates the bonding of the LED die to the backplane substrate wafer and provides more detail of possible dimensions as well as the backplane substrate construction.

Figure 11A:
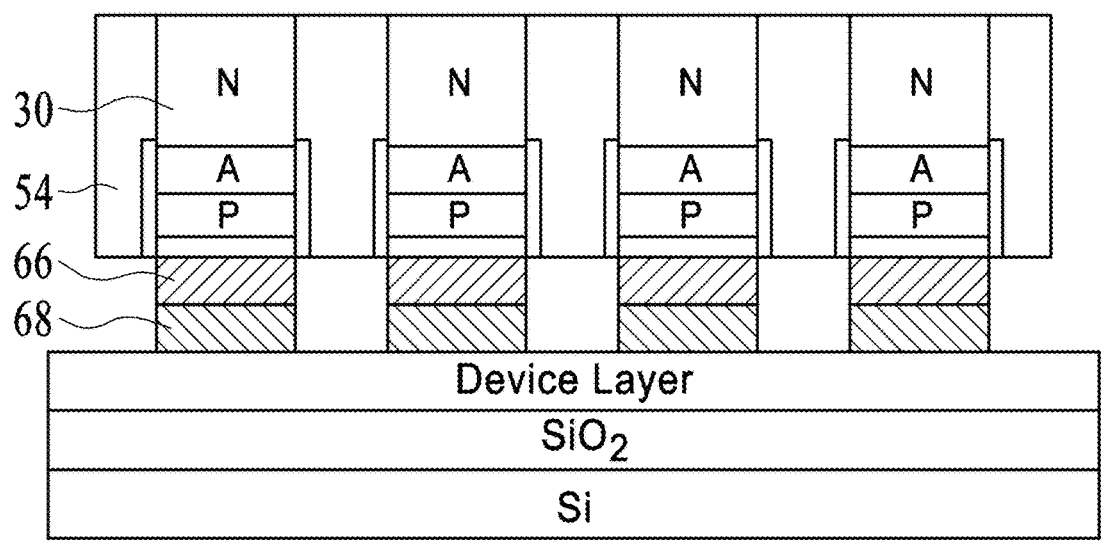

FIG. 11A illustrates the bonded structure after the sapphire growth substrate has been removed from the LED die and after the exposed surface of the LED die have been planarized to expose the N-type layer in each pillar.

Figure 11B:
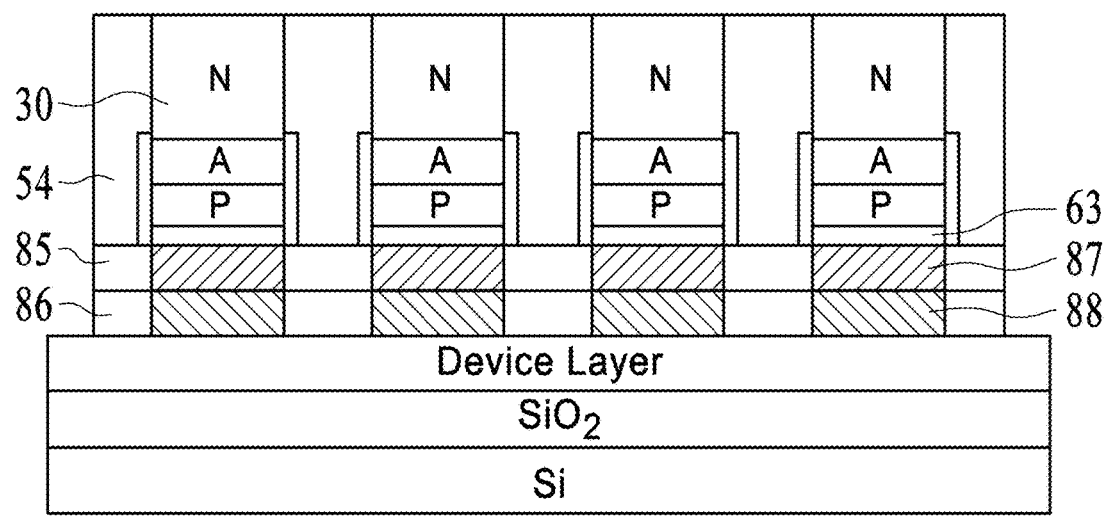

FIG. 11B illustrates an alternative embodiment for use with Cu—Cu bonding where glass ($SiO_2$) is formed between the copper electrodes, with the top surface of copper and $SiO_2$ being coplanar.

Figure 12:
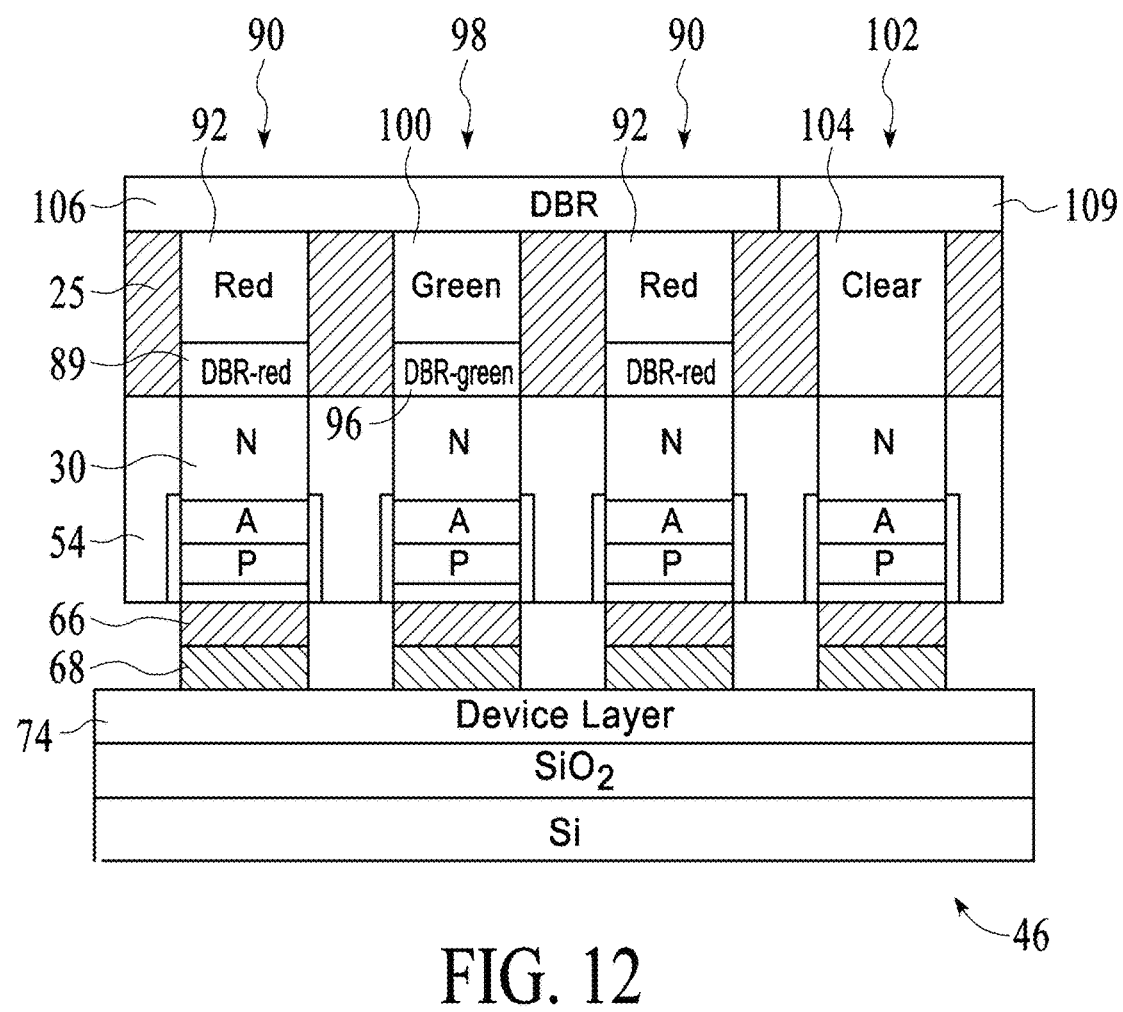

FIG. 12 illustrates the formation of distributed Bragg reflectors (DBRs) and the deposition of red and green photon energy down converter material over blue pump LEDs to form red, green, and blue addressable pixels having widths less than 1 um.

Figure 13:
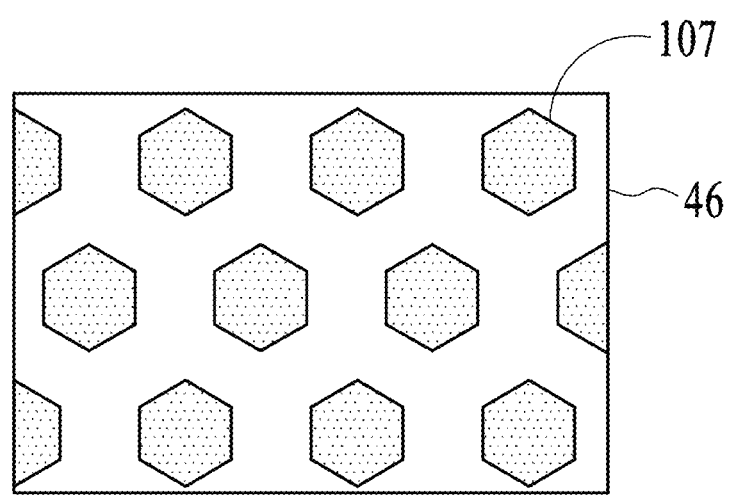

FIG. 13 is a top down view of hexagonal metal pads on a top surface of the backplane substrate. The pads may be for Cu—Cu bonding with the LED die or may support gold bumps for bonding to corresponding gold bumps on the LED die.

Figure 14:
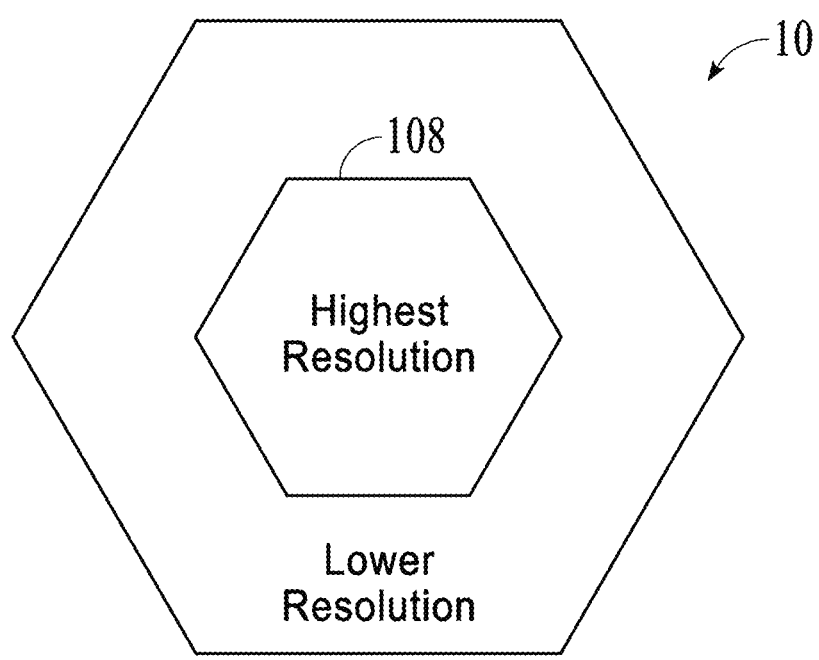

FIG. 14 illustrates the display portion and how the pixel resolution of the center portion is higher than the resolution of the outer portion to substantially correspond to the varying resolution of the human retina.

Figure 15:
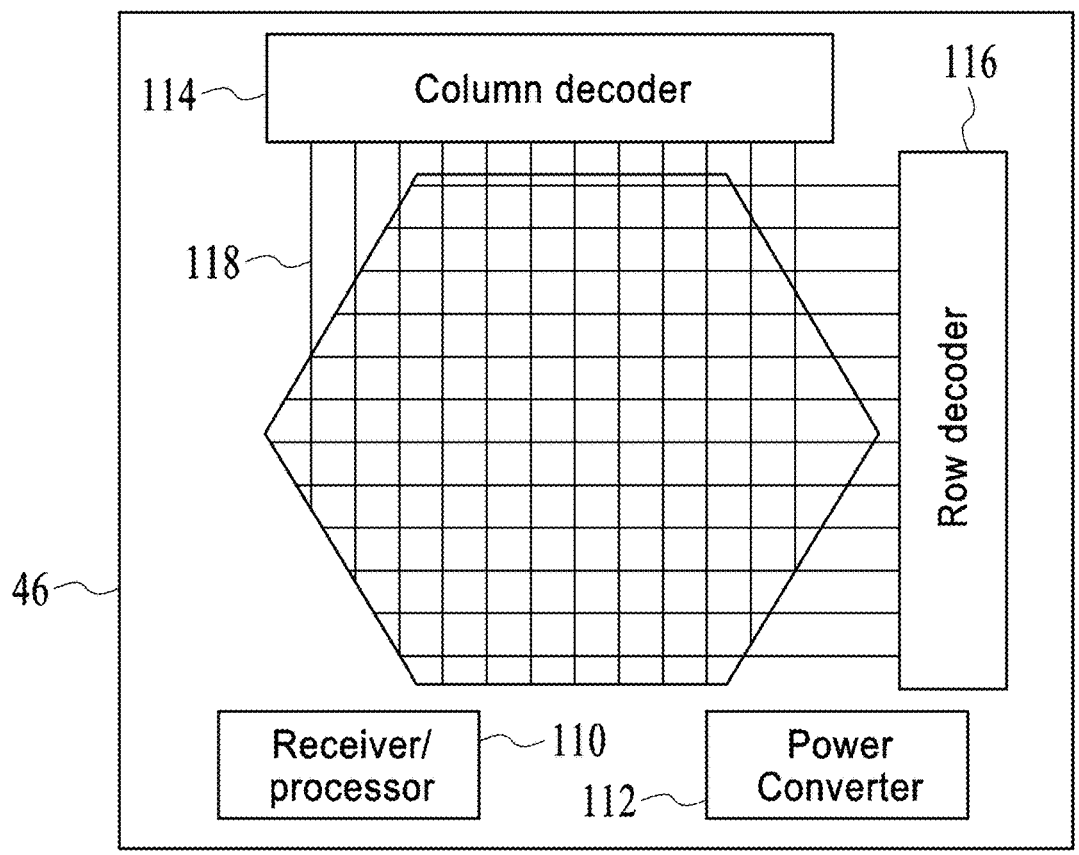

FIG. 15 schematically illustrates certain circuits on the backplane substrate, including a row and column addressing matrix, a wireless receiver/processor for image signals, and a power converter for converting an inductive power signal to a suitable operating voltage for the display. The backplane substrate wafer is bonded to the LED die, where the anode (+) connection is to the P-type layer of each pixel, and the cathode (−) common connection is to the N-metal mesh which contacts the N-type sides of each pixel.

Figure 16:
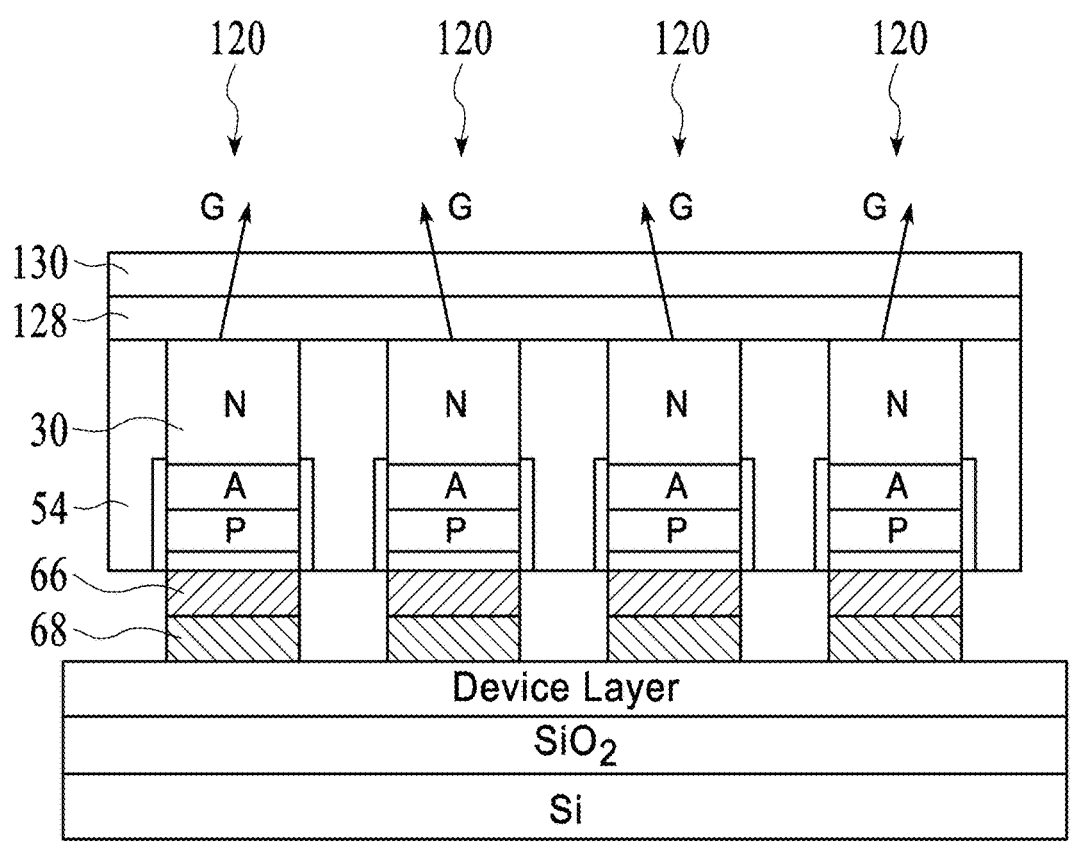

FIG. 16 is a cross-sectional view of another type of femto-display, where no down conversion material is used, and all the peak wavelengths of the LED pixels are the same.

Figure 17:
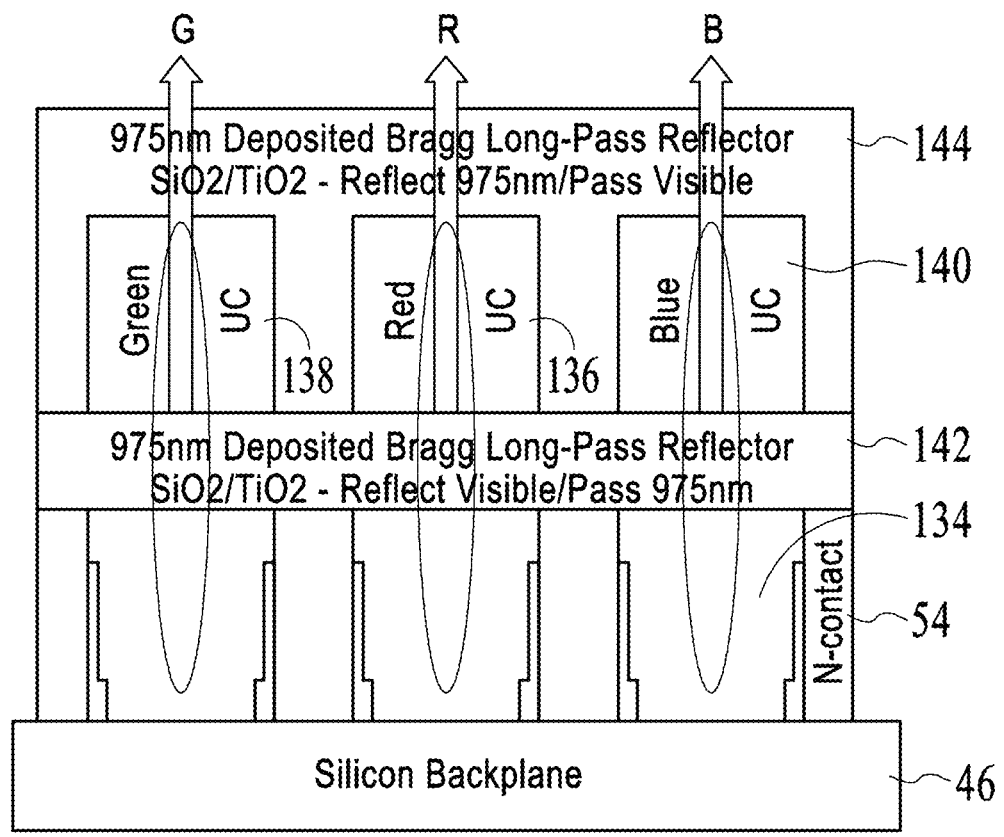

FIG. 17 is a cross-sectional view of another type of femto-display, where all the LEDs emit IR light and up-conversion materials are used to create the red, green, and blue emitting pixels.

Elements that are the same or equivalent in the various figures are labeled with the same numeral.

DETAILED DESCRIPTION

Figure 1:
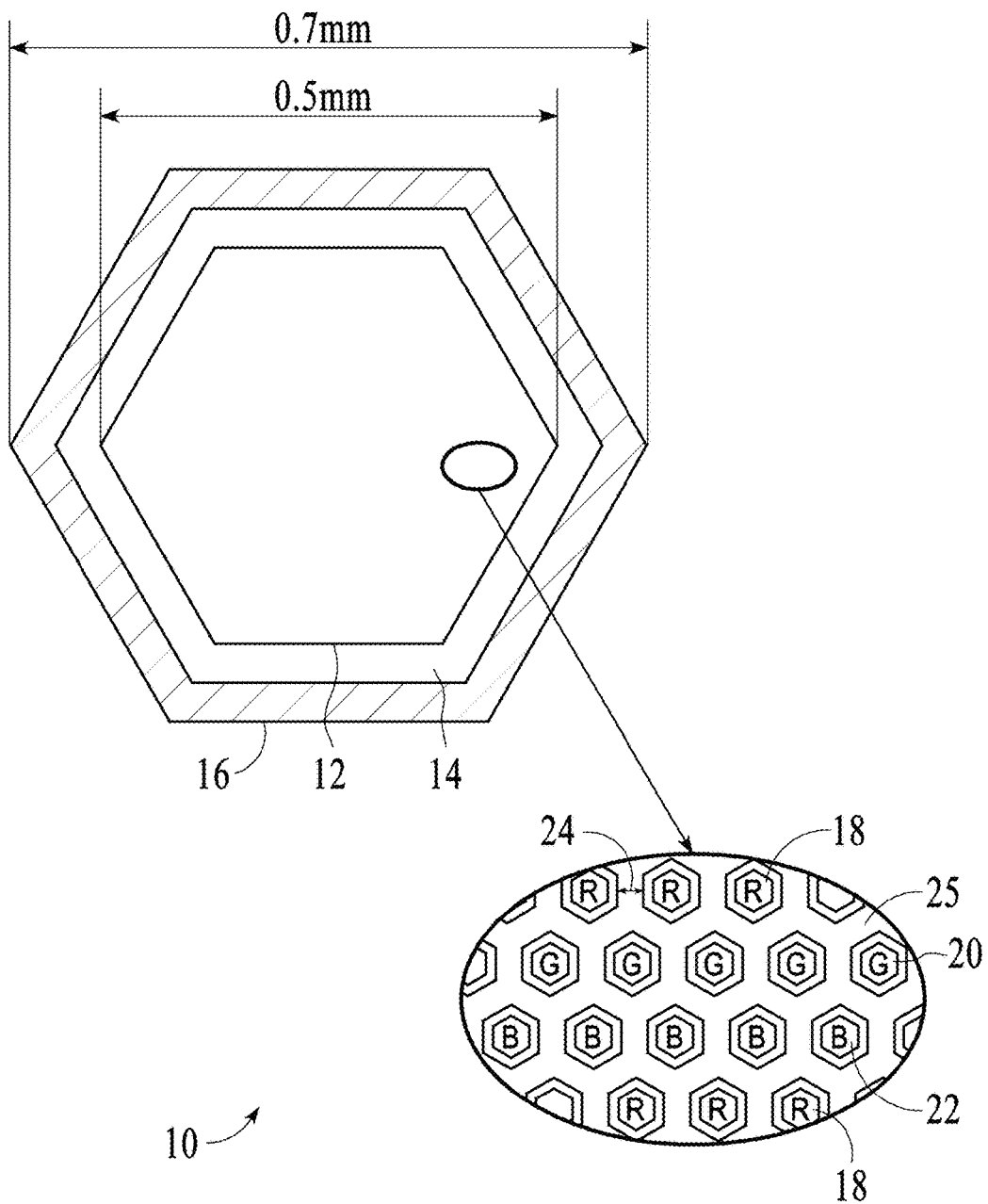
FIG. 1 is a top down view of a hexagonal LED display portion of a monolithic (i.e., single die) femto-display device, and a magnified view of an area of the display portion.

FIG. 1 is a top down view of an ultra-dense LED display 10 that acts as a projector to project an image directly onto a wearer's retina. The display 10 is shown having a hexagonal shape, but other shapes are envisioned. A die containing the hexagonal display may have a square shape.

The display 10 includes a central pixel area 12, an inactive dead space area 14, and an inactive N-ring area 16. The areas 14 and 16 are termination areas to electrically connect the cathodes (−) of all pixels to a cathode electrode on a backplane substrate, and ensure that all the pixels have similar light output characteristics. The diameter of the display 10 may be about 0.7 mm, and the diameter of the pixel area 12 may be about 0.5 mm. The diameter of each pixel is less than 2 um and preferably about 0.6 um. In one embodiment, the display contains more than 400,000 pixels with variable sizes of pixels from a minimum of 0.6 um to a maximum of 2 um.

Also shown in FIG. 1 is an expanded view of a portion of the pixel area 12, showing red pixels (R) 18, green pixels (G) 20, and blue pixels (B) 22. In one embodiment, the active layers of the LEDs within the pixels may output blue light, assuming a GaN-based LED is used, and the red and green pixels are formed using a phosphor or quantum dots to down convert the blue pump light. The gap 24 between pixels is less than 0.5 um and preferably about 0.2 um to increase the density, fill-factor, and resolution of the pixels.

The space between the pixels is filled with a reflective metal 25, such as aluminum.

The die may be a square, even though the display portion 10 is hexagonal. Around and under the display 10 may be various silicon circuitry for processing image signals, powering the device, addressing the pixels, etc.

Figure 2:
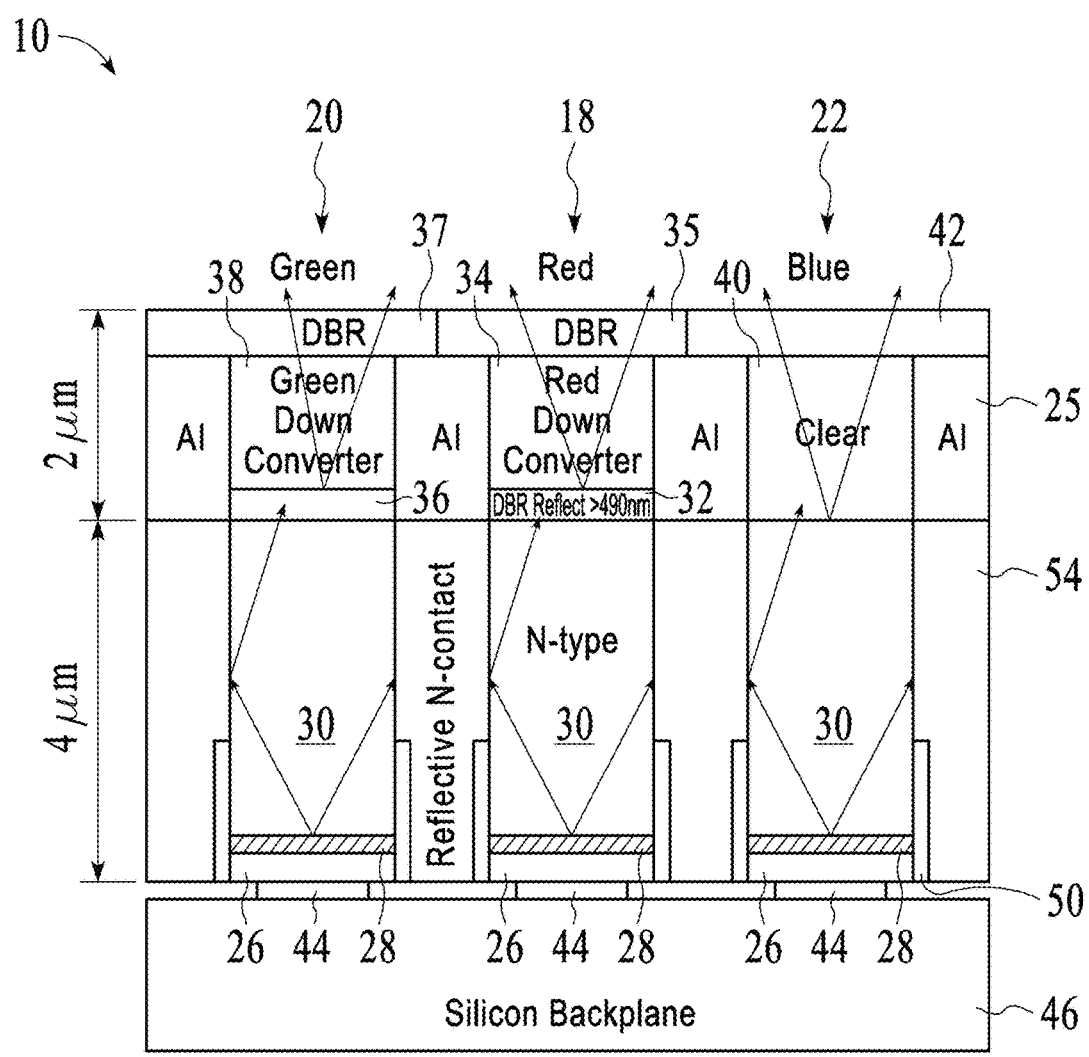
FIG. 2 is a cross-sectional view of three pixels in the display portion of FIG. 1.

FIG. 2 is a cross-section of FIG. 1 taken through a red pixel 18, a green pixel 20, and a blue pixel 22. As seen, the pixels are much taller than wide. The height of the semiconductor LED portion of the pixels may be about 4 um, while the width may be about 0.6 um. The height (i.e., thickness) of the wavelength conversion material may be less than 2 um. The GaN semiconductor regions are optically isolated from each other and electrically connected to each other by the reflective metal N-contact 54 filling the space between the pixels.

The red pixel 18 includes a thin P-type layer 26, an active layer 28, a relatively thick N-type layer 30, a distributed Bragg reflector (DBR) 32 that passes blue light but reflects red light, and a red down converter 34 such as a phosphor or quantum dots. Overlying the red down converter 34 may be a reflective DBR 35 that reflects blue light but passes red light.

The green pixel 20 is identical to the red pixel 18 except that the DBR 36 reflects green light, and a green down converter 38 overlies the blue pump LED. Overlying the green down converter 38 may be a reflective DBR 37 that reflects blue light but passes green light.

The blue pixel 22 is identical to the red pixel 18 except that no DBR or wavelength converter is needed. A clear dielectric material 40 and protective layer 42 may be formed over the blue pump LED to maintain planarity with the red and green pixels. If the blue pump light is not the desired blue display wavelength, such as when using deep blue light <430 nm, a suitable DBR and down converter material may be used to generate the desired blue display wavelength, which is preferably in the range of 455 nm to 470 nm.

A protective transparent oxide layer (not shown) may be formed over the top of the display.

Reflective P-metal electrodes 44 (anode electrodes) are formed on the P-type layer 26 and electrically contact associated metal pads on a backplane substrate 46. They also increase optical efficiency by reflecting light towards the desired output face. The substrate 46 may comprise silicon and includes addressing circuitry.

After the LED semiconductor layers are formed, they are masked and etched (e.g., by RIE) to form hexagonal trenches around each pixel area. These trenches form pillars of the semiconductor layers in a honeycomb pattern. The trenches are substantially vertical but may have a slight inward angle due to RIE etching characteristics.

A transparent dielectric material 50, such as oxide or nitride, is formed around the bottom portion of each LED sidewall to insulate the sides of the P-type layer 26 and active layer 28 in the region of the PN active junction. This may be done using masking and etching steps. The sidewalls of the N-type layer 30 are exposed.

A reflective N-metal 54 (cathode electrode) is then deposited in the trenches between the hexagonal pixels to electrically contact a large vertical sidewall area of the N-type layer 30. Preferably, over 80% of the height of the pillar is electrically contacted by the N-metal 54. The N-metal 54 may include nickel, silver, gold, aluminum, titanium, alloys thereof, or other reflective metal to achieve at least 80% reflection and may include multiple metal layers. Reflectivity and low resistance metal-semiconductor contact are important for the metal in immediate contact and within 100 nm of the N-type layer 30. Further away from N-type layer 30 can be other metal layers chosen for mechanical strength, thermal conductivity and electrical conductivity, such as copper. The side light passing through the dielectric material 50 is also reflected back by the N-metal 54. Accordingly, virtually all light generated by each blue pump LED will be emitted from the top surface (through the top of the N-type layer 30) and there will be virtually no cross-talk between pixels. The N-metal 54 also serves to mechanically support the pillars and distribute heat.

The blue light then passes through the DBR 32/36 to be converted by the red or green down converter material 34/38. The DBRs 32/36 pass the blue light but reflect back the red or green light so there is high efficiency.

Aluminum 25 is deposited over the N-metal 54 in the trenches between the hexagonal pixels to surround the DBRs 32/36, down converter material 34/38, and clear dielectric material 40. The aluminum 25 provides high reflectivity to limit cross-talk.

The N-metal 54 extends to the N-ring area 16 in FIG. 1 surrounding the display 10. The N-ring area 16 is bonded to a cathode electrode on the backplane substrate 46. In another embodiment, the aluminum 25 terminates in one or more electrodes along the perimeter of the display 10 for contacting a cathode electrode on the substrate 46.

Substantial heat may be generated by the LED pixels and in the down-converting layer above the pixels. The combination of the N-metal 54 and aluminum 25 provides a good heat conductor for removing heat from a large area of the LEDs in the pixel array and in the down-converting array and spreading the heat across the entire width of the die.

In a preferred design, the individual RGB pixels are optically fully isolated with no substantial optical path between pixels, thus preventing degradation of the resolution of the display and maintaining a large color gamut. The device preferably has optical isolation between neighboring pixels greater than 1000:1 and a color gamut defined by blue, red and green primaries with greater than 1000:1 exclusion of light from neighboring pixels.

Figure 3:
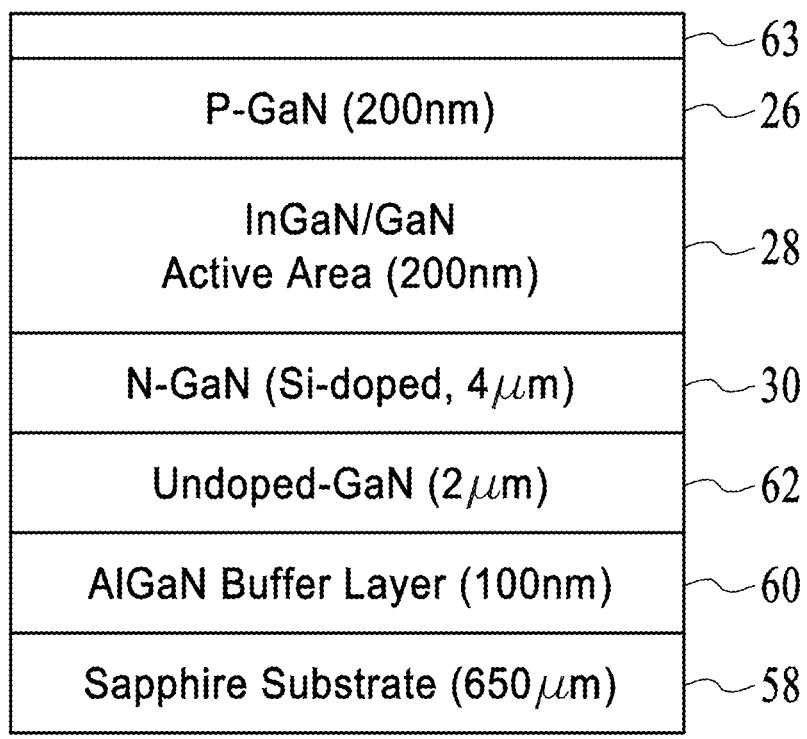
FIG. 3 is a cross-sectional view of the layers in an LED wafer prior to etching the LED wafer to form semiconductor pillars/pixels.

FIGS. 3-12 illustrate some example fabrication techniques. FIG. 3 illustrates the various layers in the LED wafer forming the pump LEDs. The layers are epitaxially grown over a sapphire substrate 58, which is later removed after the LED die are bonded to the silicon backplane substrate 46.

An AlGaN buffer layer 60 is grown over the sapphire substrate 58, followed by growing an undoped GaN layer 62, the N-type layer 30, the active layer 28, and the P-type layer 26. A reflective metal (e.g., Ni/Au/Al, ITO/Al, Ni/Ag, Ag) anode contact 63 is formed over the P-type layer 26 to electrically contact the P-type layer 26.

Metal anode contact 63 is deposited on the planar epi wafer and annealed to form a low resistivity reflective anode contact. Alternatively, a liftoff technique is used to deposit the metal anode contact 63 in the form of the pixel contact.

Figure 4:
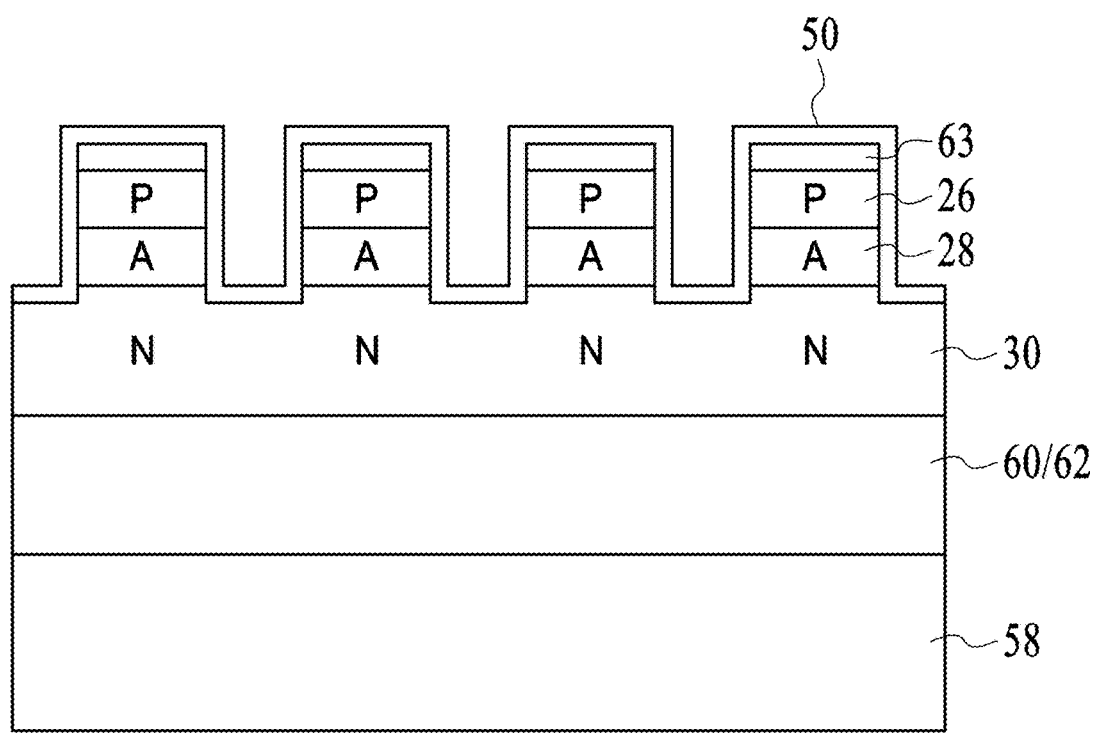
FIG. 4 illustrates a portion of the LED wafer of FIG. 3 after being etched to form trenches surrounding hexagonal pillars, where each pillar acts as an addressable pixel, and after a dielectric layer is formed over the surface.

In FIG. 4, the various LED semiconductor layers and metal anode contact 63 are masked and etched to form trenches around each hexagonal pillar. Each pillar will be a primary color pixel about 0.5-1 um wide, with a gap between pixels of about 0.6 um or less. The etching depth is below the PN junction. A dielectric material 50 is formed over the metal anode contact 63, P-type layer 26, and insulates the PN junction in the active layer 28. The preferred transparent dielectric material 50 is $SiO_2$, SiN, or $Al_2O_3$. These are chosen for their optical transparency, high electrical breakdown voltage, and availability of pinhole-free deposition techniques. For $Al_2O_3$, a thin aluminum layer may be formed using atomic layer deposition (ALD) followed by wet oxidation of the Al layer. The dielectric side-wall thickness is preferably less than 0.05 um.

Figure 5:
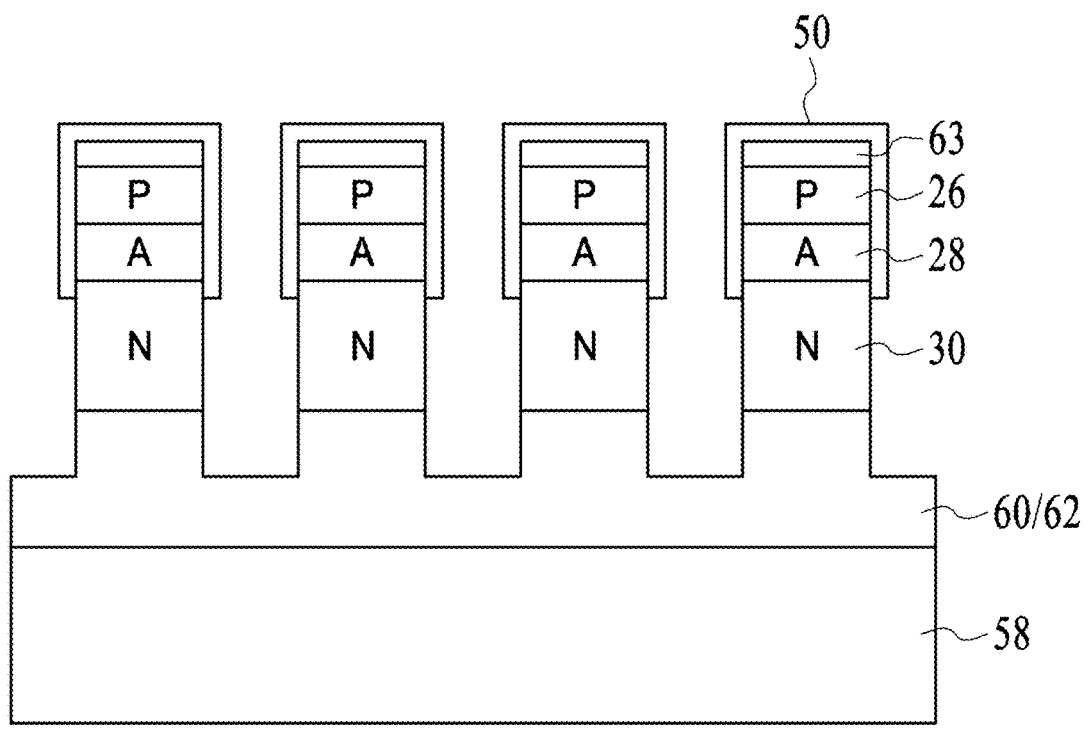
FIG. 5 illustrates the structure of FIG. 4 after further etching of the trenches through the N-type layer.

In FIG. 5, the etching of the gap between the pixels is extended through the transparent dielectric material 50 in the bottom of the etched trench down below the N-type layer 30 and optionally down to the substrate 58. The sides of the N-type layer 30 are exposed. The N-type layers 30 of each pillar are isolated from each other. There is no contiguous N-type layer connecting adjacent pillars.

Figure 6:
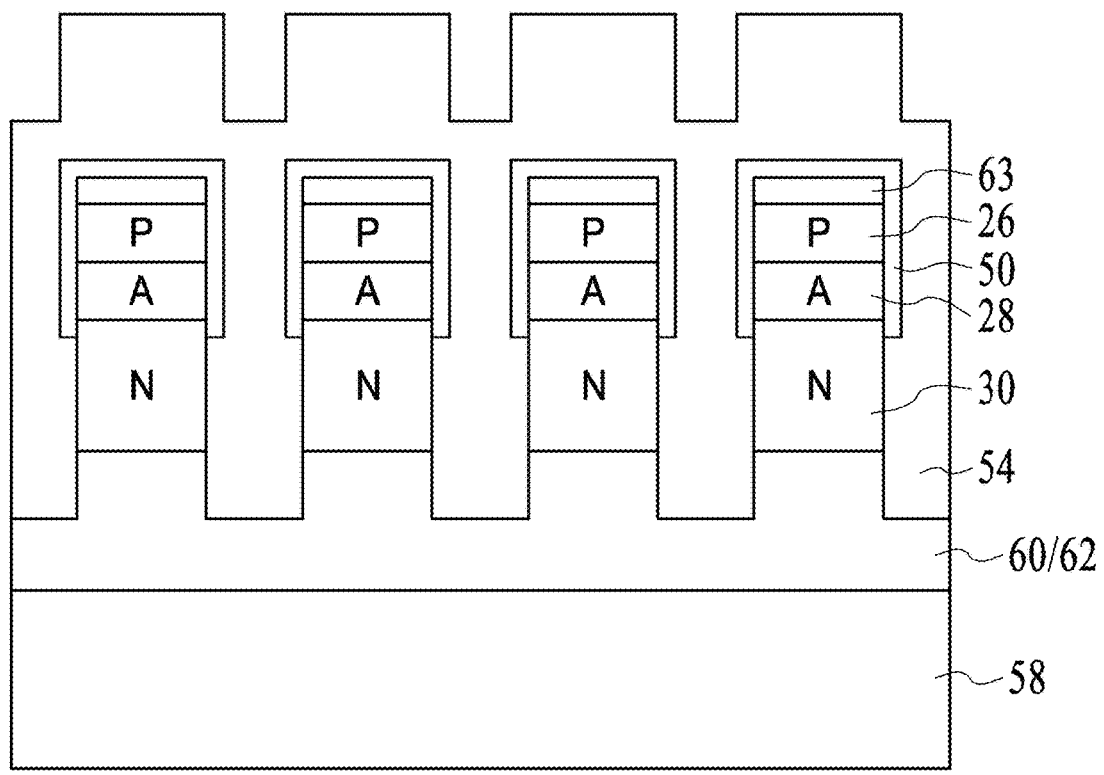
FIG. 6 illustrates the sidewalls of the P-type layer and the active layer being coated with a transparent dielectric material to prevent electrical shorting of the PN junction, followed by deposition of a reflective N-metal within the trenches to electrically contact the vertical sidewalls of the N-type layers in the pillars.

As shown in FIG. 6, a suitable reflective N-metal 54 (e.g., Al, Ti/Al) is deposited in the trenches and over the pillars. The N-metal 54 electrically contacts the sides of the N-type layer 30 but is insulated from the anode contact 63, P-type layer 26, and active layer 28 by the dielectric layer 50. Since a large area is contacted by the N-metal 54, there is good current spreading, consistent cathode voltage between pixels, and low contact resistance.

Figure 7A:
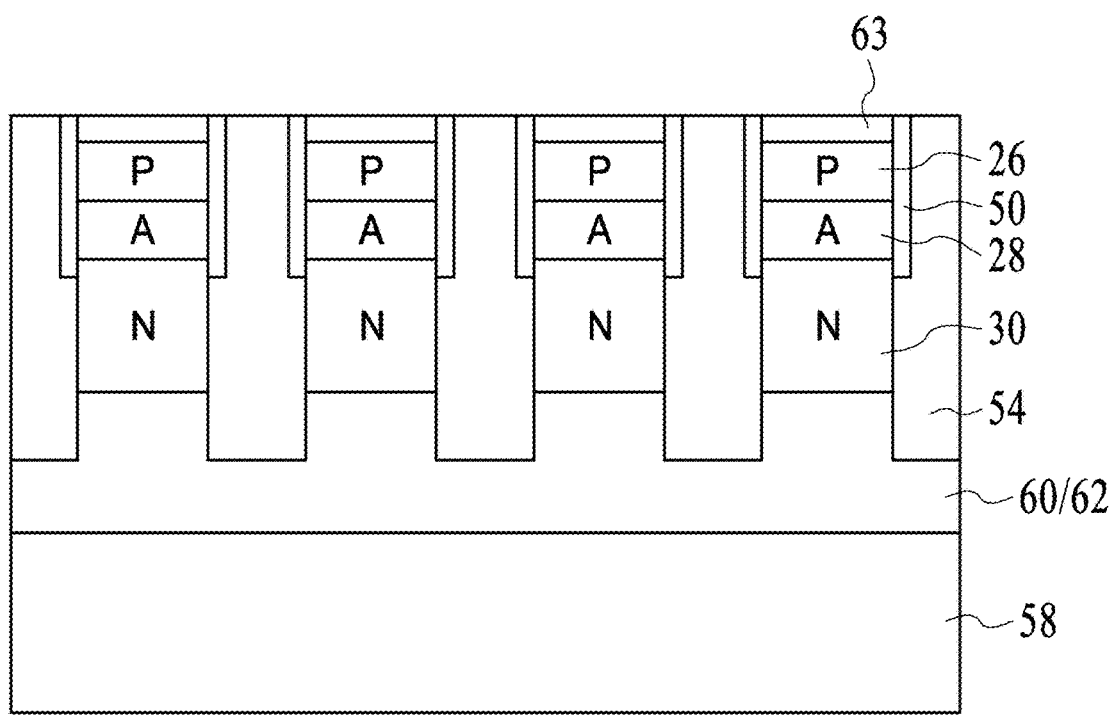
FIG. 7A illustrates the top surface of the LED wafer after planarization using CMP, where both the reflective metal over the P-type layer and the N-metal contact are exposed and co-planar.

As shown in FIG. 7A, a chemical mechanical polishing (CMP) process is performed to planarize the top surface and expose the anode contact 63, the cathode contact 54, and the dielectric 50 on the same plane.

Figure 7B:
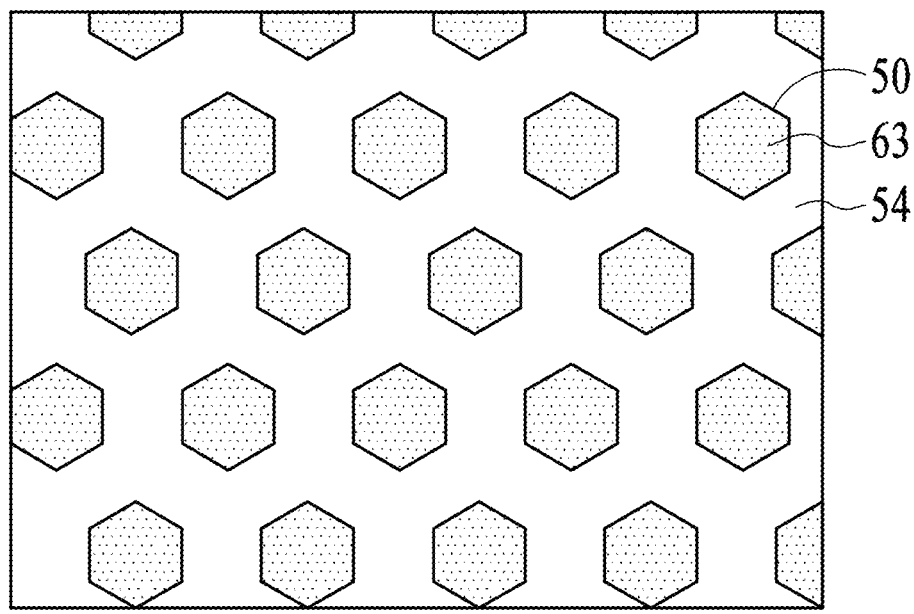
FIG. 7B is a top down view of the structure of FIG. 7A.

FIG. 7B is a top down view of the structure of FIG. 7A and shows the pixel area after CMP, where the top surface containing the anode contact 63, N-metal (cathode) 54, and dielectric material 50 is planar.

Figure 8:
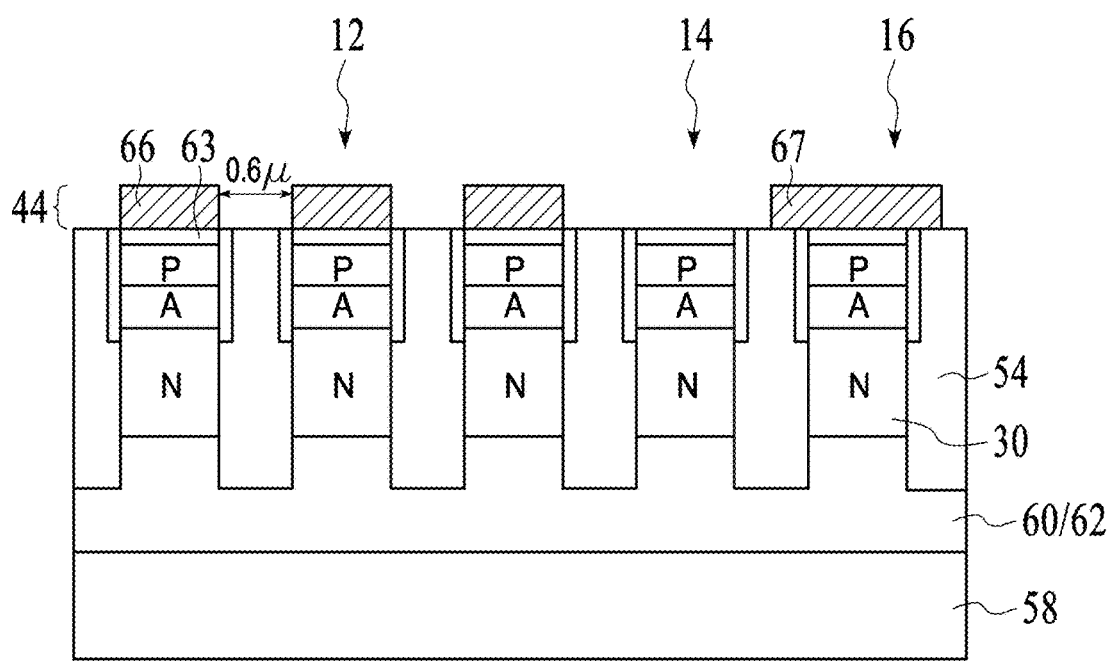
FIG. 8 illustrates the formation of metal contact bumps on top of the anode (P) contact.

In FIG. 8, metal bumps 66 are formed over the anode contacts 63 and, at the same time, metal bumps 67 are formed in the N-ring area 16 electrically connected to the N-metal 54. Note that the LED pillars under the N-ring area 16 are shorted by the metal bumps 67 and do not emit light by design. The combination of the anode contacts 63 and metal bumps 66 forms the P-metal electrodes 44 in FIG. 2.

Preferred bump materials include indium, tin, AuSn, gold, and copper. The planarity of the "soda-can" LED device after CMP and the small area of the display make the soda-can LEDs compatible for using Cu—Cu bonding to Cu pads on a silicon CMOS backplane wafer. Cu—Cu bonding requires planarity of less than few nm across the array, which is enabled by the soda-can LED device design.

The LED wafer is then singulated, and the LED die are bonded to a silicon backplane wafer as described below.

In FIG. 9, the metal bumps 66 and 67 on the LED die are bonded to corresponding metal bumps 68 and 69 on a silicon backplane substrate 46, also shown in FIG. 2. Ultrasonic bonding (typically using gold bumps) or thermo-compression In—In bonding or Cu—Cu bonding may be used.

Mating bump metals can include Au—Au, AuSn—Au, In—In, Sn—Sn, and most preferably Cu—Cu. Cu—Cu is not used in conventional LED array manufacturing because of the extreme flatness required on both the backplane and the device side (typically <2 nm RMS flatness over the Cu—Cu contact area of entire array). The soda-can LED device structure is designed to match with requirements of Cu—Cu bonding, such that surface anode and cathode contacts are co-planar by CMP preferably to within 2 nm. The cathode contact is shown on the left side of FIG. 9 and is the preferred design of the N-ring area 16 shown in FIG. 1, formed along edges of the die on the same surface as the anode contacts and electrically connected to the N-metal 54. CMP may be performed after the metallization step to planarize the anode and cathode bumps (e.g., Cu). Each LED anode and cathode bump is less than a few microns across, such as less than one micron across, so that dishing during CMP of Cu can be minimized to less than a few nm over the entire array, which may be less than 1 mm across.

The substrate 46 comprises silicon 70 with an insulating oxide layer 72. MOSFET drivers, addressing circuitry, and various conductors are located in a device layer 74. Other types of substrates may be used. For example, the oxide layer 72 may be deleted. The gold bumps 66 and 68 may be deposited on hexagonal metal pads to match the shape of the pillars. As previously mentioned, Cu—Cu bonding can also be used.

The remaining figures are out of the field of view of the N-ring area 16.

Figure 10:
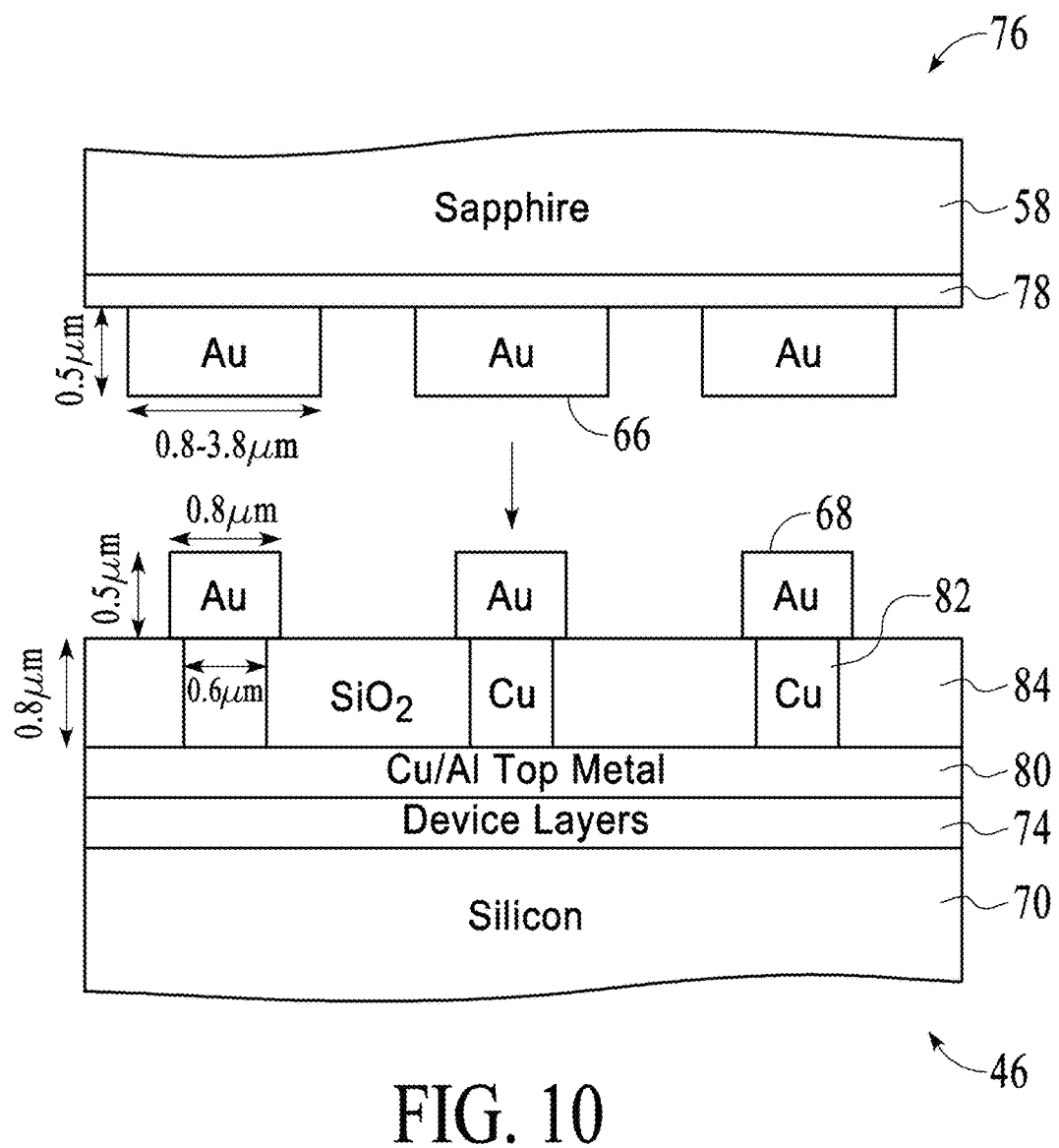

FIG. 10 is a simplified view of the LED die 76 showing the sapphire substrate 58, semiconductor layers 78, and gold bumps 66. The backplane substrate 46 is shown without an oxide layer. Conductive traces are represented by the Cu metal layer 80. Copper contacts 82 electrically contact the conductors, and an oxide layer 84 is between the copper contacts 82. The gold bumps 68 are formed over the copper contacts 82. In some embodiments, the oxide layer can extend to top surface of the gold bumps 68.

To energize a pixel, a voltage is applied between a gold bump 68 on the substrate 46, electrically contacting a P-type layer of one of the pillars, and another gold bump on the substrate 46 electrically contacting the N-metal 54 (FIG. 2), via the N-ring area 16 of FIG. 1, which electrically contacts all the N-type layers 30 of the pillars. The N-metal 54 may be connected to ground, and the gold bumps 68 are connected to address circuitry, such as using row and column lines, where an energized intersection of a column line and row line lights up the pixel at that location. A transistor may be at each pixel location in the device layer 74 to apply a voltage/current to the corresponding gold bump 68. This is referred to as an active matrix. In one embodiment, CMOS circuitry is used to address a pixel, and a digitally controllable current source applies a variable current to that pixel to control its brightness. Conventional addressing techniques may be used.

FIG. 11A illustrates the bonded structure after the sapphire substrate 58 (FIG. 9) has been removed by laser lift-off. In one embodiment, the trench is etched down to the substrate leaving no semiconductor connection between LED pillars after the sapphire substrate 58 is removed. In another embodiment, the AlGaN buffer layer 60 (FIG. 3) and the undoped GaN layer 62 have been removed by etching after the removal of the substrate 58 to isolate the individual LED pillars. In all cases, the side of the LED previously connected to the sapphire substrate 58 is planar. The backplane substrate 46 provides mechanical support.

FIG. 11B illustrates a variation on the embodiment of FIG. 11A, where the bonding is Cu—Cu bonding. Glass 85 ($SiO_2$) is formed around each of the LED pixels, such as by deposition and CMP down to expose the copper anode contacts 63 and cathode contacts. The glass 85 is not formed over the reflective anode contacts 63. A similar glass 86 layer is formed over the substrate 46. A copper seed layer is formed in the openings of the glass 85 and 86 if plating is to be used. Then, copper 87 and 88 is plated or otherwise deposited to fill the open areas of the glass 85 and 86. The LED wafer surface and the substrate 46 surface are then polished using CMP so that both surfaces are planar (planarity within 2 nm). The copper 87/88 forms electrodes for the substrate 46 and LED pixels. The copper 87/88 is then made to be slightly recessed using a short wet etch of the copper 87/88, if there is insufficient dishing of the copper during the CMP planarization.

The LED wafer is then diced, and the die are then bonded to the substrate 46 wafer as follows. The LED die are aligned with the substrate 46 wafer and the structures are pressed together (e.g., at 100 psi) under heat (e.g., 200° C.) so that the glass 85/86 surfaces bond. As the heat is raised (e.g., to 300° C.), the thickness of the copper 87/88 expands greater than the thickness of the glass 85/86, and the opposing copper electrodes contact each other to form a low resistivity contact. Cu atoms diffuse to also create a good mechanical bond. The temperature expansion coefficient of copper is about 16 ppm/C, while the temperature expansion coefficient of glass is about 0.6 ppm/C. The bonding process may take 30 minutes.

In this configuration, bonding happens first between the $SiO_2$ on the silicon backplane side and the $SiO_2$ on the LED side at a low temperature of ~200° C. under thermal compression. Subsequently, the bonded wafer is heated above 200° C. such that the copper on both the silicon backplane and the LED device side expand sufficiently to contact each other and make a thermo-compression bond. The compression in this case is only due to the difference in thermal expansion coefficients between $SiO_2$ and copper.

The remaining figures assume the bonding technique of FIG. 5A is used, but either bonding method may be used.

In FIG. 12, a DBR 89 is formed over the blue pump LED pillar for a red pixel 90. The DBR 89 comprises many layers that, in conjunction, pass blue light but reflect red light. In this way, red light is not absorbed by the LED. A red down converter material 92 overlies the DBR 89. The down converter material may be phosphor or quantum dots.

Similarly, a DBR 96 is formed over the blue pump LED pillar for a green pixel 98. The DBR 96 passes blue light but reflects green light. A green down converter material 100 overlies the DBR 96. The down converter material may be phosphor or quantum dots.

Over the blue pixel 102 is a clear dielectric 104 so the top surface is planar.

In the hexagonal gaps between the down converter material of adjacent pillars is deposited aluminum 25. The aluminum 25 surrounding the pillars forms a reflective containment of converted light to prevent optical cross-talk between different color pixels within the color conversion layer. The aluminum 25 also helps mechanically support the down converter material and define its shape. A top down view of FIG. 12 is similar to the magnified portion in FIG. 1.

The thickness of the down conversion material should be thin to maximize efficiency and to minimize the height of the entire device. For quantum dots, such thickness should be on the order of 1.5 um. State of the art color conversion layers are 10-50 um thick, so special design considerations must be taken to convert greater than 99% of the pump blue light to the desired color. Conversion of greater than 99% of the pump blue light to the desired color is desirable to maintain color purity of the converted color pixels and thus maintain a good color gamut of the entire RGB display. One technique is to form a polymer matrix that deterministically arranges quantum dot crystals for optimal conversion and maximum solid density. Quantum dot densities $>10^{21}/cm^3$ for quantum dots of diameter 6 nm are preferred to achieve more than 99% conversion within 1.5 um thickness.

A DBR 106 may be deposited over the top of the display to reflect the incident pump blue light to reduce the leakage of pump light through the color converted pixel. The DBR 106 can also be designed to partially collimate the pixel emission. In the case shown in FIG. 12 where blue light directly from the LED is used for the blue pixel, the reflective DBR 106 is removed from the area above the blue pixel. In one embodiment, the area above the blue pixel is replaced with a clear dielectric 109 which can be planarized, for example, by CMP.

The wavelength conversion layers over the N-type layer 30 may be formed as a separate wafer or die and then bonded to the top of the LED die or LED wafer.

FIG. 13 is a top down view of hexagonal metal pads 107 on the backplane substrate 46 that support the gold bumps 68 (FIG. 11), corresponding to the gold bumps 66 on the LED die. The metal pads 107 may instead be copper for Cu—Cu bonding to the LED die.

FIG. 14 illustrates how the pixel density (resolution) is reduced away from the center portion 108 of the display 10. The display 10 projects its image directly onto the retina. The retina has a central fovea which contains the densest concentration of cones. Outside of the fovea, there is a lower density of cones. Accordingly, there is no need for the display 10 to have a high resolution outside of its central area 108. This improves the efficiency of the display 10 since the resolution is not higher than required outside of the fovea area. The resolution of the display 10 in the center area 108 should be indistinguishable from the perceived resolution of the real world by the fovea. The resolution of the display outside the central region can smoothly decrease consistent with the decrease in resolution of the retina away from the fovea. Accordingly, the displayed image may be indistinguishable from reality over the entire displayed image, including the part of the image in the high resolution fovea and as the resolution drops moving away from the central foveal region.

In the fovea area, a 20/20 resolution on the retina needs a pitch between white (RGB composite) pixels of about 6 um on the retina. If the display is encapsulated in a contact lens, the display will be about 25 mm from the retina. If the optic in front of the display has a magnification of about 3× and a white composite pixel is made up of RGGB pixels, then the pitch between white pixels on the display must be less than 2 um (6 um/3) and the pitch between individual color pixels must be further reduced by factor of 2 and therefore must be less than 1 um. There is a desire to keep the display less than 1 mm in size so as not to substantially block the real world light entering the pupil. A minimum pupil size is typically 2 mm in diameter, meaning that a 1 mm diameter circular obstruction would block about 25% of the real world light for a minimum pupil size of 2 mm diameter. In order to image on the retina a substantial Field of View (FOV), the center foveal pixel spacing in the LED display should be at a pitch less than 1 um in order to display images on the retina indistinguishable from reality. The pitch is thus less than the height of each pixel (pillar).

The sizes of the LED pixels may be varied across the display to achieve a projected image that matches the resolution of the retina, with the highest resolution at the center of the fovea.

FIG. 15 schematically illustrates one possible addressing technique used in the backplane substrate 46 for addressing a particular pixel by applying a voltage to the associated gold bump 68 (FIG. 12) for that pixel. The die may be 0.5-1 mm across. Image signals may be transmitted to the backplane substrate 46 using RF or other means. In one embodiment, radio frequency signals (e.g., about 13 MHz) are received by an antenna and processed by the receiver/processor 110. The power converter 112 and receiver/data processor 110 can be integrated into the display backplane or integrated into a separate power/data chip with the data receiver/processor 110 and the power converter 112 electrically connected to the display backplane by wires. Power may be received by the antenna via resonant inductive coupling and converted to the appropriate voltage and polarity by a power converter 112. The power signal and the image signals will be at different frequencies so that the signals can be separated out on the substrate 46 using appropriate coupling circuits on the substrate 46. This allows the monolithic display die to be encased in a contact lens or the lens of glasses. The image signals include addressing signals that are decoded by a column decoder 114 and a row decoder 116. Traces 118 in the device layer of the substrate 46 "intersect" at each pixel location. Control voltages on a selected column line and row line turn on a transistor for conducting current to the selected pixel. The color brightness may be controlled by PWM or by the magnitude of the current. Low power CMOS switches may be used to address pixels. The relative brightness of the red, green, and blue pixels in a single full color pixel determines the perceived color for that composite pixel.

In an example of the display being incorporated in a contact lens or a lens of glasses, the power converter 112 and receiver/processor 110 are separated from the backplane substrate 46 in a separate chip, and both chips are separately encased in the contact lens or the lens of the glasses. The power/data chip is located away from the pupil so as to not obstruct vision. Small wires connect metal pads on the backplane substrate 46 to metal pads on the power/data chip embedded in the lens. A thin wire loop antenna is also connected to pads on the power/data chip and encased in the lens.

All fabrication processing preferably is performed on a wafer scale. The LED wafer is diced and individual, or groups of, LED dies are attached to the backplane substrate 46 wafer, as described above. If the color conversion layers are formed as separate die, the color conversion die are then attached to the LED die on top of the backplane substrate 46 wafer, which is then singulated to form separate display die (i.e., a substrate die bonded to an LED pixel die), having edges less than 1 mm.

In the embodiment disclosed above, all the LEDs emitted blue light, and down converter material was used to create red and green light. FIG. 16 illustrates a technique where a monochrome display is fabricated. Thus, no wavelength conversion material is needed. All the LEDs are GaN based to generate a single color, such as blue or green, or the LEDs are AlInGaP based to generate a single color such as red or amber. Schematically illustrated are four green LEDs 120. The reflective N-metal 54 electrically contacting the N-type layers and surrounding the hexagonal pillars may be the same as that previously described. The gold bumps 68 contacting the P-type layers may be the same as previously described. A DBR layer 128 may provide collimation. A transparent oxide layer 130 protects the device.

FIG. 17 illustrates another type of LED pixels where all the LEDs 134 emit infra-red pump light (e.g., 975 nm wavelength), and the light is converted to either red, green, or blue using a red up converter material 136, a green up converter material 138, and a blue up converter material 140. A first DBR layer 142 passes the IR pump light and reflects visible wavelength light. A second DBR layer 144 passes the visible light and reflects back the IR light for improved efficiency. The growth substrate is GaAs.

The individual pillars may also be resonant cavity LEDs or vertical cavity surface emitting lasers.

Although the device described herein is a full color display using pillars of LED pixels, similar techniques may be used to form an array of vertical transistors, photodetectors and other semiconductor devices.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A monolithic device comprising:
   a light emitting diode (LED) array comprising:
   an array of pillars of semiconductor layers; the semiconductor layers including an N-type layer, an active layer, and a P-type layer; the pillars having a height greater than their width;
   a fill that vertically surrounds the pillars and fills a space between the pillars, the fill including a reflective metal; the reflective metal providing mechanical support for the pillars, providing optical isolation between the pillars, and electrically contacting the N-type layer of each pillar along sidewalls of the N-type layers; and
   a dielectric material insulating sidewalls of the P-type layer and the active layer from the reflective metal.

2. The device of claim 1 further comprising:
   a substrate die having addressing circuitry, the substrate die comprising:
   an array of contacts electrically contacting the P-type layers of the pillars for selectively energizing each of the pillars when a voltage is applied between one of the contacts and the reflective metal contacting the N-type layers.

3. The device of claim 2 wherein the pillars are configured such that light is emitted from a top surface of the N-type layer of each pillar, in a direction opposite to the substrate die, and the reflective metal reflects light emitted from sidewalls of the pillars back into the pillars.

4. The device of claim 1 wherein the semiconductor layers are epitaxially grown on a growth substrate, and trenches are etched through the semiconductor layers to form the array of semiconductor pillars.

5. The device of claim 1 wherein each of the pillars has a hexagonal cross-sectional shape.

6. The device of claim 1 wherein the sidewalls of the pillars are vertical sidewalls.

7. The device of claim 1 wherein the pillars are arranged into pixels, each pixel having a width of less than 1 um.

8. The device of claim 1 wherein the pillars are arranged into pixels, each pixel having a width of less than 3 um.

9. The device of claim 1 wherein the active layers in the pillars include different amounts of indium to control a peak wavelength of the pillars, such that some of the pillars generate red light, some of the pillars generate green light, and some of the pillars generate blue light.

10. The device of claim 1 wherein a pitch between pillars is less than a height of the pillars.

11. The device of claim 1 wherein the LEDs are IR LEDs.

12. The device of claim 1 wherein the fill entirely fills all of the space between the pillars.

13. A monolithic device comprising:
a light emitting diode (LED) array comprising:
an array of pillars of semiconductor layers; the semiconductor layers including an N-type layer, an active layer, and a P-type layer; the pillars having a height greater than their width;
a fill between the pillars, the fill including a reflective metal; the reflective metal providing mechanical support for the pillars, providing optical isolation between the pillars, and electrically contacting the N-type layer of each pillar along sidewalls of the N-type layers; and
a dielectric material insulating sidewalls of the P-type layer and the active layer from the reflective metal;
a down conversion material overlying the N-type layer of certain ones of the pillars for down converting light emitted by the active layer to a primary color for a display; and
a substrate die having addressing circuitry, the substrate die comprising:
an array of contacts electrically contacting the P-type layers of the pillars for selectively energizing each of the pillars when a voltage is applied between one of the contacts and the reflective metal contacting the N-type layers.

14. The device of claim 13 further comprising a second reflective metal surrounding the down conversion material.

15. The device of claim 13 wherein a thickness of the down conversion material is less than 5 um.

16. The device of claim 13 further comprising a distributed Bragg reflector layer between the N-type layer and the down conversion material, the distributed Bragg reflector layer passing light emitted by the active layer and reflecting the down-converted light.

17. The device of claim 13 further comprising a distributed Bragg reflector layer overlying the down conversion material, the distributed Bragg reflector layer reflecting light emitted by the active layer back into the down conversion material and passing the down-converted light.

18. A monolithic device comprising:
a light emitting diode (LED) array comprising:
an array of pillars of semiconductor layers; the semiconductor layers including an N-type layer, an active layer, and a P-type layer; wherein a ratio of height to width for the pillars is at least 5:1;
a fill between the pillars, the fill including a reflective metal; the reflective metal providing mechanical support for the pillars, providing optical isolation between the pillars, and electrically contacting the N-type layer of each pillar along sidewalls of the N-type layers; and
a dielectric material insulating sidewalls of the P-type layer and the active layer from the reflective metal.

19. A monolithic device comprising:
a light emitting diode (LED) array comprising:
an array of pillars of semiconductor layers; the semiconductor layers including an N-type layer, an active layer, and a P-type layer; the pillars having a height greater than their width;
a fill between the pillars, the fill including a reflective metal; the reflective metal providing mechanical support for the pillars, providing optical isolation between the pillars, and electrically contacting the N-type layer of each pillar along sidewalls of the N-type layers; and
a dielectric material insulating sidewalls of the P-type layer and the active layer from the reflective metal;
an up-conversion material overlying the N-type layer of certain ones of the pillars for up-converting light emitted by the active layer to a primary color for a display; and
a substrate die having addressing circuitry, the substrate die comprising:
an array of contacts electrically contacting the P-type layers of the pillars for selectively energizing each of the pillars when a voltage is applied between one of the contacts and the reflective metal contacting the N-type layers.

20. The device of claim 19 further comprising a distributed Bragg reflector between the N-type layer and the up conversion material, the distributed Bragg reflector layer passing light emitted by the active layer and reflecting the up-converted light.

21. The device of claim 19 further comprising a distributed Bragg reflector layer overlying the up-conversion layer, the distributed Bragg reflector layer reflecting light emitted by the active layer back into the up conversion material and passing the up-converted light.

* * * * *